US008680750B2

(12) United States Patent
Kang et al.

(10) Patent No.: US 8,680,750 B2
(45) Date of Patent: Mar. 25, 2014

(54) PIEZOELECTRIC POWER GENERATOR FOR FEEDING EMERGENCY POWER

(75) Inventors: Hyung Won Kang, Seoul (KR); Hyeung-Gyu Lee, Seoul (KR); Woo Sung Lee, Seongnam-si (KR); Seung Ho Han, Yongin-si (KR); Chan Sei Yoo, Uiwang-si (KR); Hwi Yeol Park, Seoul (KR)

(73) Assignee: Korea Electronics Technology Institute, Seongnam-Si, Gyeonggi-Do (KR)

( * ) Notice: Subject to any disclaimer, the term of this patent is extended or adjusted under 35 U.S.C. 154(b) by 267 days.

(21) Appl. No.: 13/074,277

(22) Filed: Mar. 29, 2011

(65) Prior Publication Data

US 2012/0161583 A1    Jun. 28, 2012

(30) Foreign Application Priority Data

Dec. 23, 2010  (KR) .................. 10-2010-0133446

(51) Int. Cl.
*H02N 2/18* (2006.01)
*H01L 41/113* (2006.01)

(52) U.S. Cl.
CPC ............. *H02N 2/186* (2013.01); *H01L 41/113* (2013.01)
USPC ....................................................... 310/339

(58) Field of Classification Search
CPC .............. H01L 41/113; H01L 41/1132; H01L 41/1134; H01L 41/1136; H01L 41/1138; H02N 2/18; H02N 2/181; H02N 2/183; H02N 2/185; H02N 2/186; H02N 2/188
USPC ........................................................ 310/339
See application file for complete search history.

(56) References Cited

U.S. PATENT DOCUMENTS

| 7,692,363 B2* | 4/2010 | Butler et al. ................... 310/329 |
| 8,030,825 B2* | 10/2011 | Howarth ........................ 310/339 |
| 2007/0145861 A1* | 6/2007 | Tanner ........................... 310/339 |
| 2007/0278902 A1* | 12/2007 | Rastegar et al. ............... 310/339 |
| 2008/0174273 A1* | 7/2008 | Priya et al. .................... 320/114 |

FOREIGN PATENT DOCUMENTS

KR    1020100092806    8/2010

OTHER PUBLICATIONS

Korean Office Action for 10-2010-0133446 dated Oct. 31, 2011, citing the above reference(s).

* cited by examiner

*Primary Examiner* — Derek Rosenau
(74) *Attorney, Agent, or Firm* — Lowe Hauptman & Ham, LLP

(57) ABSTRACT

A piezoelectric power generator for feeding emergency power, includes a frame; a fixing unit comprising a left fixing body coupled to an upper left side of the frame and a right fixing body coupled to an upper right part of the frame; a first piezoelectric body bonded to a right side of the left fixing body; a second piezoelectric body bonded to a left side of the right fixing body; and a vibration unit bonded between the first piezoelectric body and the second piezoelectric body and vibrating vertically.

12 Claims, 9 Drawing Sheets

FIG 9
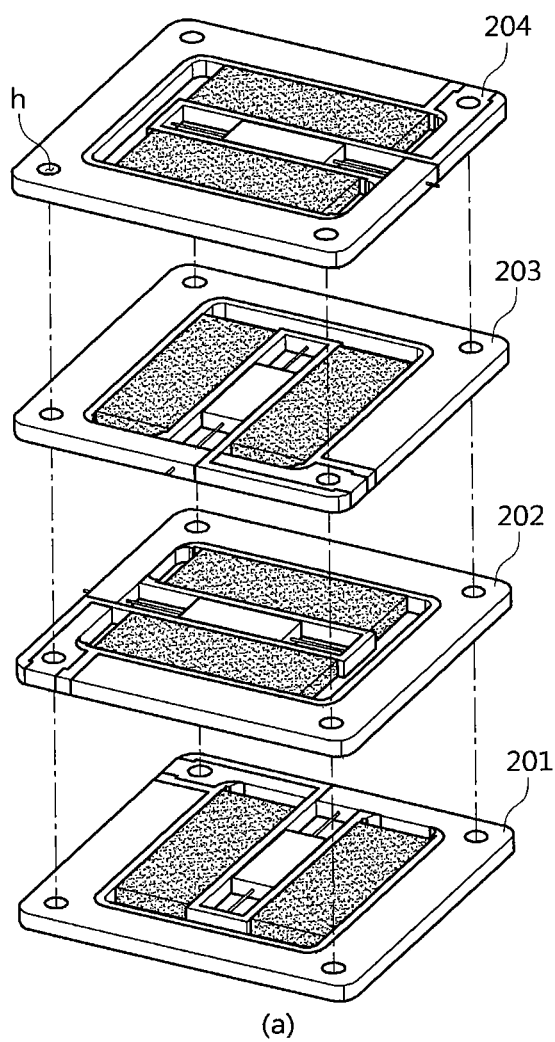
(a)
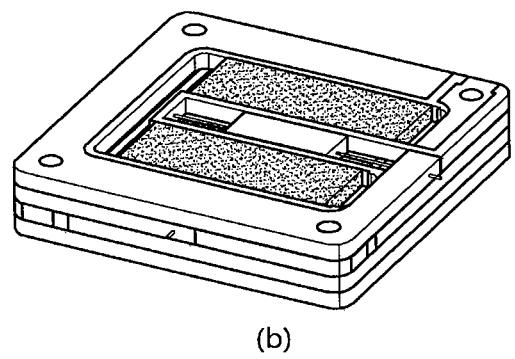
(b)

PIEZOELECTRIC POWER GENERATOR FOR FEEDING EMERGENCY POWER

CROSS-REFERENCE TO RELATED APPLICATION(S) AND CLAIM OF PRIORITY

The present application claims the benefit under 35 U.S.C. §119(a) to a Korean patent application filed in the Korean Intellectual Property Office on Dec. 23, 2010, and assigned Serial No. 10-2010-0133446, the entire disclosure of which is hereby incorporated by reference.

TECHNICAL FIELD OF THE INVENTION

The present invention relates generally to a piezoelectric power generator. More particularly, the present invention relates to a piezoelectric power generator for feeding emergency power.

BACKGROUND OF THE INVENTION

As mobile communication and portable electronic devices are closely related to our real life, a charged battery in case of emergency can cause serious trouble to users. In this regard, necessity of a portable or auxiliary power feeding apparatus used in the mobile communication or portable electronic device is increasing.

As the emergency power feeding apparatus, a piezoelectric power generator can suggest a solution. When an external mechanical energy (wind, instrumental vibrations, etc.) is applied, the piezoelectric power generator produces power using a piezoelectric effect inducing polarization (electric energy) inside a material.

Meanwhile, a piezoelectric body which is a core material of the piezoelectric power generator includes three basic modes based on three elements of a polarization direction, a poling direction, and a piezoelectric body deformation direction. The basic modes are a 31 mode, a 33 mode, and a 15 mode. In each mode, the former number indicates the electrical polarization direction and the latter number indicates the mechanical displacement direction.

For example, it is assumed that an electrode is spread over an upper part and a lower part in every piezoelectric body (an electrical field direction of every piezoelectric body is perpendicular to the ground). In this case, the 31 mode generates the electrical polarization direction perpendicular to the mechanical displacement direction, the 33 mode generates the same electrical polarization direction as the mechanical displacement direction, and the 15 mode generates a shear strain (sliding) with the electrical polarization direction in parallel with the mechanical displacement direction.

FIG. 1 is a schematic diagram of a 15-mode piezoelectric body. In FIG. 1, A1 indicates the 15-mode piezoelectric body before the deformation and A2 indicates the 15-mode piezoelectric body after the deformation.

Piezoelectric power energy is affected by a displacement constant of the piezoelectric body, a piezoelectric voltage constant, and the applied force. Typically, in the piezoelectric material, the 31 mode has the smallest piezoelectric voltage constant and the 15 mode has the greatest piezoelectric voltage constant. Without considering the shape, the greatest energy value can be obtained in the 15-mode piezoelectric body. Yet, it is difficult to manufacture the 15-mode piezoelectric body because the shear strain is required.

On account of those shortcomings, a conventional piezoelectric power generator mainly employs the 31-mode piezoelectric body which is relatively easy to implement. However, since the 15-mode piezoelectric body exhibits the power generation ten times greater than the 31-mode piezoelectric body, the piezoelectric power generator using the 15-mode piezoelectric body is demanded.

SUMMARY OF THE INVENTION

To address the above-discussed deficiencies of the prior art, it is a primary aspect of the present invention to provide a piezoelectric power generator for feeding emergency power adoptable to a portable telephone and a portable electronic device by applying a 15-mode piezoelectric body to the piezoelectric power generator.

According to one aspect of the present invention, a piezoelectric power generator for feeding emergency power, includes a frame; a fixing unit including a left fixing body coupled to an upper left side of the frame and a right fixing body coupled to an upper right part of the frame; a first piezoelectric body bonded to a right side of the left fixing body; a second piezoelectric body bonded to a left side of the right fixing body; and a vibration unit bonded between the first piezoelectric body and the second piezoelectric body and vibrating vertically.

The piezoelectric power generator may further include an elastic unit connected to a top part and a bottom part of the vibration unit with one end.

The piezoelectric power generator may further include a mass connected to the other end of the elastic unit and disposed inside an upper part and a lower part of the frame respectively.

The elastic unit may be an elastic wire or a spring.

According to another aspect of the present invention, a piezoelectric power generator for feeding emergency power includes a frame including an exterior unit and a partition unit projecting and extending from an upper part to an inner side of the exterior unit, and dividing an inner space; a first piezoelectric body disposed between a left side of the exterior unit and a left side of the partition unit; a second piezoelectric body disposed between a right side of the exterior unit and a right side of the partition unit; and a vibration unit disposed to vertically vibrate inside the partition unit.

One or more first piezoelectric bodies and second piezoelectric bodies may be disposed.

The vibration unit may be fabricated with tungsten (W), gold (AU), or Bismuth (Bi).

The piezoelectric power generator may further include an electrode unit connected to the first piezoelectric body and the second piezoelectric body respectively.

Two or more piezoelectric power generators for feeding the emergency power may be stacked by crossing at 90 degrees.

The piezoelectric power generator may further include a case unit for covering an exterior of the piezoelectric power generators.

By applying the 15-mode piezoelectric body to the piezoelectric power generator, the considerable piezoelectric power can be attained, compared to the 31-mode piezoelectric body.

In addition, with the notable portability, the emergency power can be fed to the mobile communication and portable electronic devices in the emergency.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 9 is a schematic diagram of an application of the piezoelectric power generator for feeding the emergency power of FIG. 7.

Throughout the drawings, like reference numerals will be understood to refer to like parts, components and structures.

DETAILED DESCRIPTION OF THE INVENTION

Certain exemplary embodiments of the present disclosure will now be described in greater detail with reference to the accompanying drawings.

Figure 1:
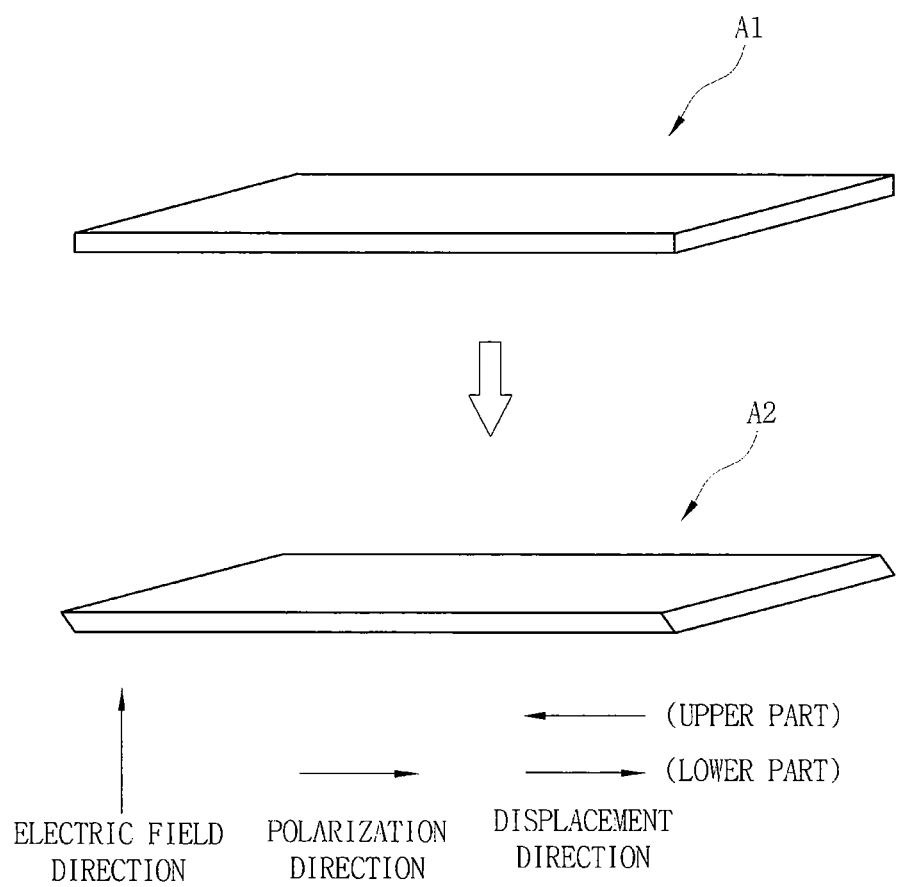
FIG. 1 is a schematic view of a 15-mode piezoelectric body.
Figure 2:
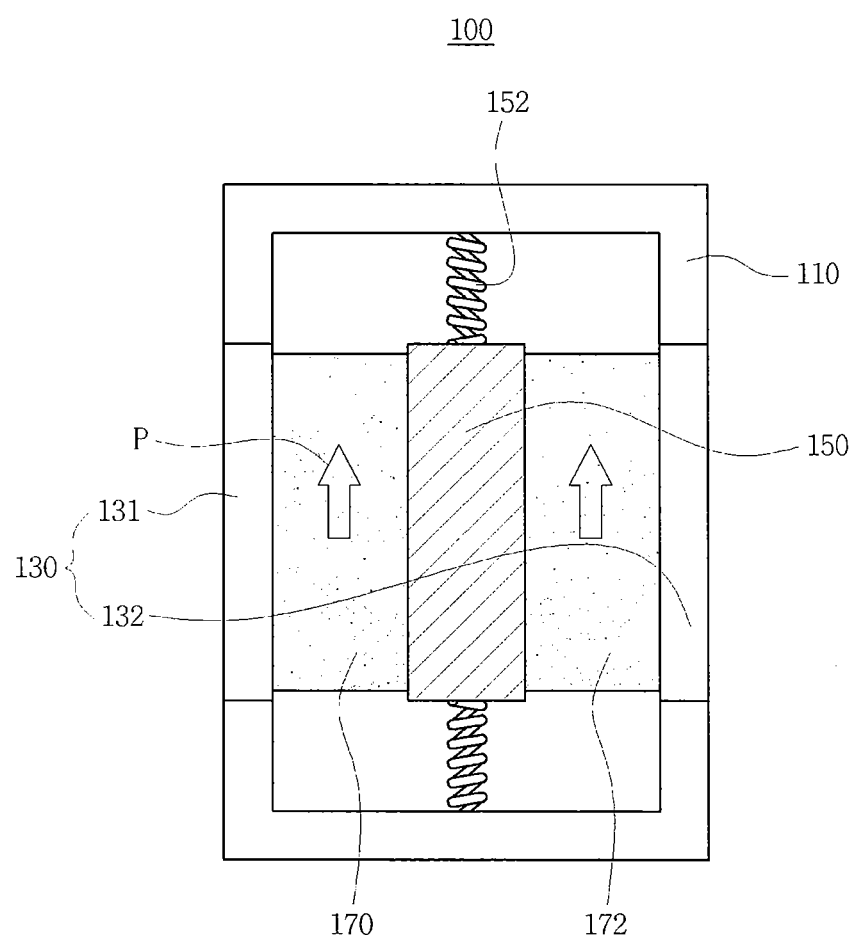
FIG. 2 is a front view of a piezoelectric power generator for feeding emergency power according to an exemplary embodiment of the present invention.
Figure 3:
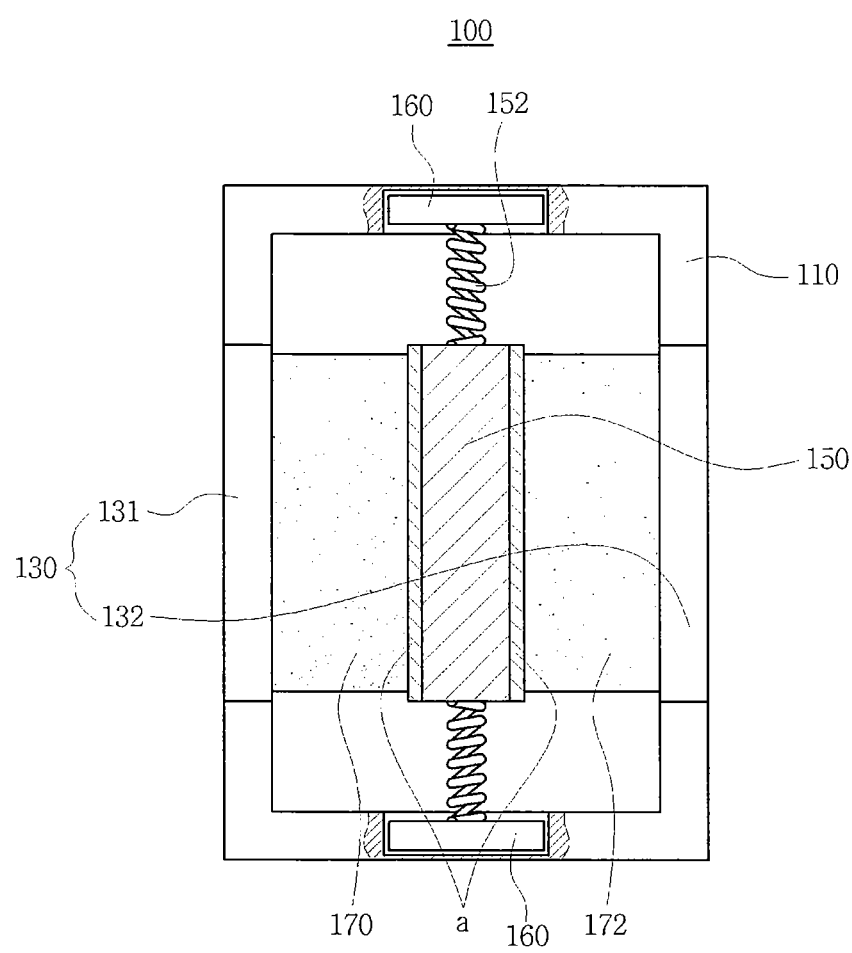
FIG. 3 is a sectional view of the piezoelectric power generator for feeding emergency power of FIG. 2.

FIG. 2 is a front view of a piezoelectric power generator 100 for feeding emergency power (hereafter, referred to as a piezoelectric power generator) according to an exemplary embodiment of the present invention. FIG. 3 is a sectional view of the piezoelectric power generator 100 for feeding emergency power.

Referring to FIGS. 2 and 3, the piezoelectric power generator 100 includes a frame 110, a fixing unit 130, a first piezoelectric body 170, a second piezoelectric body 172, and a vibration unit 150.

The frame 110 is a body of the piezoelectric power generator 100 for feeding emergency power. The frame 110 transfers an external force to the piezoelectric bodies 170 and 172.

At least one of a shape or a size of the frame 110 is not limited. For example, the frame 110 can be formed as a square frame. The size of the frame 110 can be a portable size. Hence, the frame 110 can be connected or bonded to a portable electronic device.

To ease the understanding, the square frame 110 is mainly described.

The fixing unit 130 is coupled to both sides of the frame 110. The fixing unit 130 is bonded to the piezoelectric bodies 170 and 172 to shear-deform the piezoelectric bodies 170 and 172.

The fixing unit 130 includes a left fixing body 131 and a right fixing body 132. The left fixing body 131 is coupled to an upper left part of the frame 110. The right fixing body 132 is coupled to an upper right part of the frame 110. The left fixing body 131 and the right fixing body 132 can be coupled to part of the left side and the right side of the frame 110.

The piezoelectric bodies include the first piezoelectric body 170 and the second piezoelectric body 172. A left side of the first piezoelectric body 170 is bonded to a right side of the left fixing body 131. A right side of the second piezoelectric body 172 is bonded to a left side of the right fixing body 132.

The piezoelectric bodies 170 and 172 can be formed of, but not limited to, a material exhibiting the piezoelectric effect. For example, the piezoelectric bodies 170 and 172 can be formed of PZT (Pb(Ti, Zr)O$_3$), Ba$_2$TiO$_4$, and BaTiO$_3$.

At least of the shape or the size of the piezoelectric bodies 170 and 172 is not limited. For example, the piezoelectric bodies 170 and 172 can be formed such that their cross section is square. The piezoelectric bodies 170 and 172 can be formed in a size accommodated in the frame 110.

The piezoelectric power generator 100 can further include an electrode unit a connected to the first piezoelectric body 170 and the second piezoelectric body 172. For instance, the electrode unit a can include electrodes in either side of the first piezoelectric body 170 and the second piezoelectric body 172. Accordingly, the piezoelectric bodies 170 and 172 (the 15-mode piezoelectric body) can cause the shear deformation perpendicular to the electric field direction with the polarization direction P in parallel with the displacement direction (the vertical direction).

The polarization direction P is upward or downward based on the front side of the first piezoelectric body 170 and the second piezoelectric body 172. To ease the understanding, the upward polarization direction P is depicted in FIG. 2.

The vibration unit 150 is interposed between the first piezoelectric body 170 and the second piezoelectric body 172. The vibration unit 150 vibrates vertically to shear-deform the piezoelectric bodies 170 and 172.

One side of the vibration unit 150 is bonded with the right side of the first piezoelectric body 170. The other side of the vibration unit 150 is bonded with the left side of the second piezoelectric body 172.

The connections of the piezoelectric power generator 100 include the left fixing body 131, the first piezoelectric body 170, the vibration unit 150, the second piezoelectric body 172, and the right fixing body 132 in order from the left to the right. The vibration unit 150 can be implemented using a Printed Circuit Board (PCB).

The piezoelectric power generator 100 can further include an elastic unit 152. The elastic unit 152 is connected to the top side and the bottom side of the vibration unit 150 with one end.

When the external force is removed, the elastic unit 152 restores the vibration unit 150 to the original position. In other words, the external force can be continuously transferred to the piezoelectric bodies 170 and 720 using the elastic unit 152.

The elastic unit 152 can employ, but not limited to, any elastic material. For example, the elastic unit 152 can be an elastic wire or a spring. To facilitate the understanding, the elastic unit 152 which is the spring is mainly described.

The piezoelectric power generator 100 can further include a mass 160. The mass 160 is coupled with the other end of the elastic unit 152. The mass 160 is disposed to move vertically in the upper part and the lower part of the frame 110. The mass 160 is vertically shifted by the external force to transfer the external force to the vibration unit 150 through the elastic unit 152.

The mass 160 has a specific gravity to thus ascend or descend the vibration unit 150 with the applied external force. The mass 160 can be fabricated with tungsten (W), gold (AU), or Bismuth (Bi), which have a relatively great specific gravity among the metals.

That is, the connections of the piezoelectric power generator 100 include the first mass 160, the first elastic unit 152, the vibration unit 150, the second elastic unit 152, and the second mass 160 in order from the top to the bottom. The terms 'first' and 'second' are used to distinguish the two masses 160 and the two elastic units 152, not to indicate different components.

Hereafter, operations of the piezoelectric power generator 100 are described.

Figure 4:
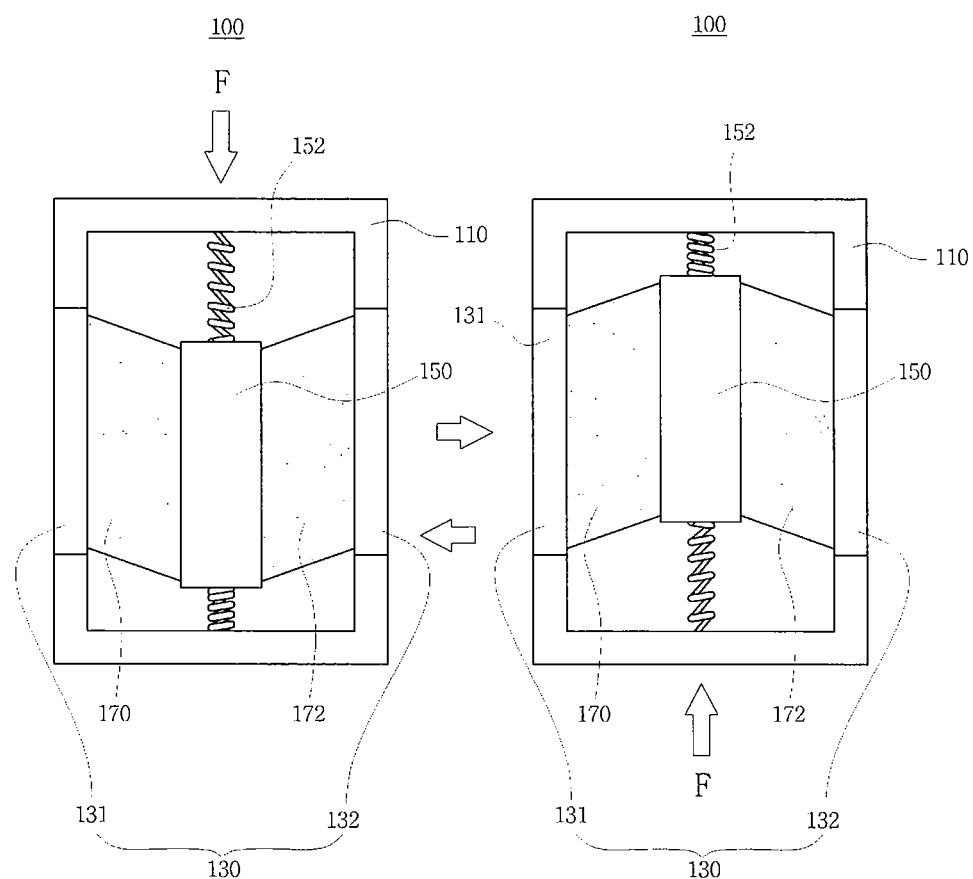
FIG. 4 is an operational diagram of the piezoelectric power generator for feeding the emergency power of FIG. 2.

FIG. 4 is an operational diagram of the piezoelectric power generator for feeding the emergency power of FIG. 2.

Referring to FIG. 4, when the external force (for example, the vertical vibration) is applied to the piezoelectric power generator 100 and the piezoelectric power generator 100 ascends or descends, the vibration unit 150 is lifted or lowered by the elastic unit 152 connected to the mass 160.

The piezoelectric bodies 170 and 172 are fixed to the left fixing body 131 and the right fixing body 132 of the frame 110 with one sides, and are bonded to the vibration unit 150 with the other sides. Hence, when the vibration unit 150 moves up or down, the piezoelectric bodies 170 and 172 are pulled down or pushed up.

That is, the piezoelectric bodies 170 and 172 are subject to the shear deformation to generate the electricity. The generated electricity can be accumulated to an accumulator or a battery via a rectifier circuit.

Figure 5:
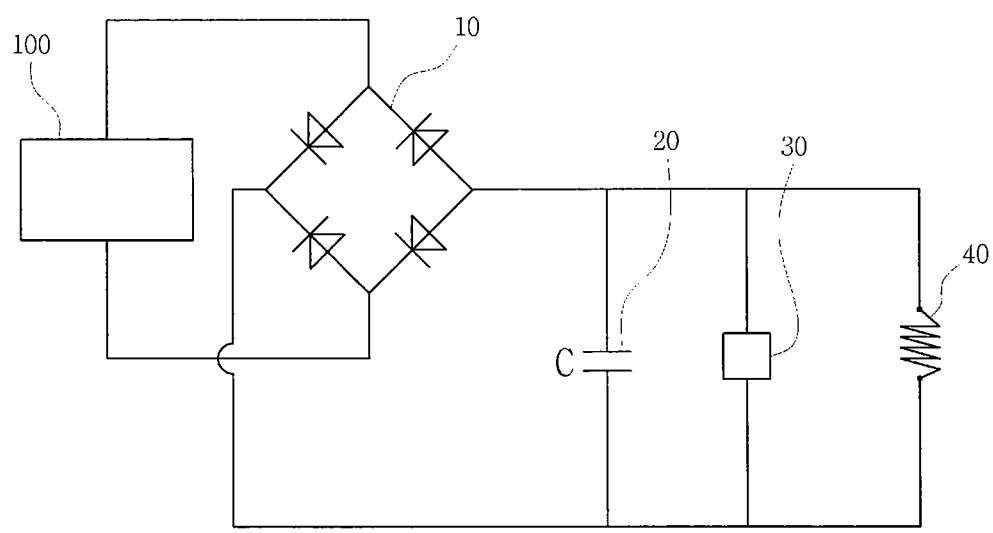
FIG. 5 is a circuit diagram for converting and storing a piezoelectric energy of the piezoelectric power generator for feeding the emergency power of FIG. 2.

FIG. 5 is a circuit diagram for converting and storing the piezoelectric energy of the piezoelectric power generator 100 of FIG. 2.

Referring to FIG. 5, according to the vertical vibration of the piezoelectric power generator 100, the piezoelectric bodies 170 and 172 are deformed. The electric current generated by the deformation flows in the same direction via a rectifier 10. To use the current as a direct current power source, the current is smoothed by connecting a capacitor 20. Next, the power source is converted to a constant voltage source through a constant voltage circuit 30 to thus supply the voltage to a load 40.

Figure 6:
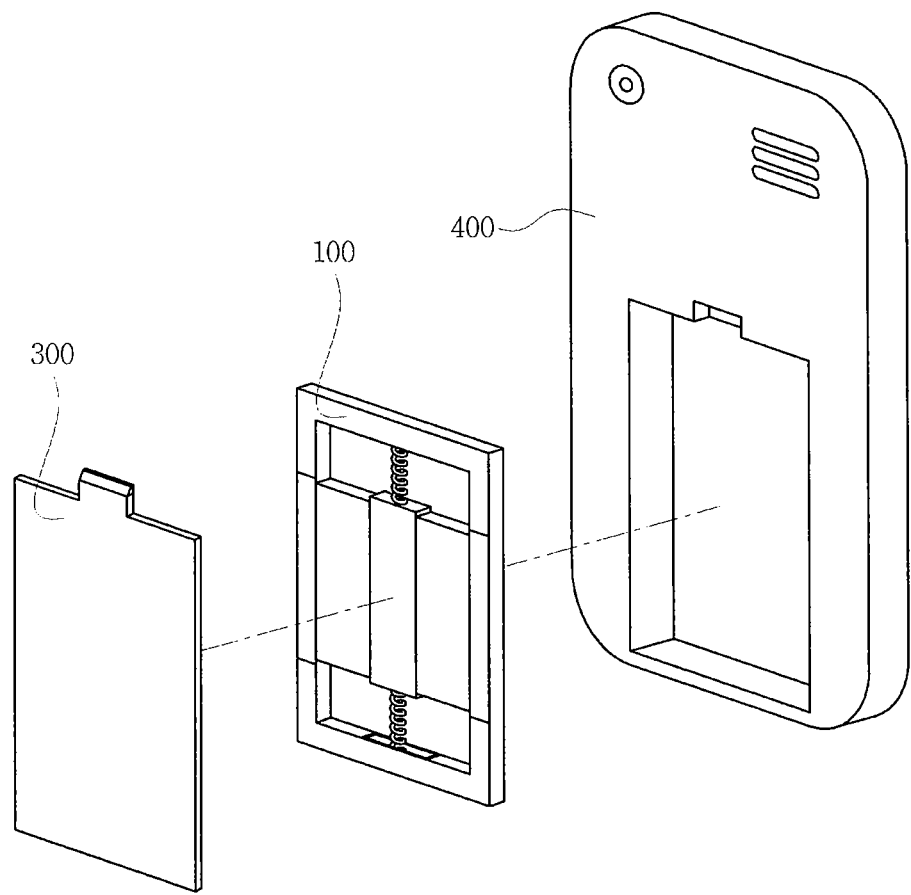
FIG. 6 is a diagram of the use of the piezoelectric power generator for feeding the emergency power of FIG. 2.

FIG. 6 is a diagram of the use of the piezoelectric power generator 100 of FIG. 2. In FIG. 6, the piezoelectric power generator 100 can further include a case unit 300 for covering the exterior.

The case unit 300 guides the front side or the front and rear sides of the frame 110. Thus, the case unit 300 blocks the vibration unit 150 from vibrating in other directions than the vertical direction. The case unit 300 can be formed of an insulating material such as plastic. The case unit 300 can be fabricated in a box shape.

Meanwhile, the piezoelectric power generator 100 can be accommodated in a portable phone terminal or a portable electric device. The piezoelectric power generator 100 can be mounted to the exterior to supply the power.

For instance, the piezoelectric power generator 100 can be used the power source which charges a battery (an accumulator) attached to the portable electronic device 400.

Accordingly, in case of emergency, a user can charge his/her portable electronic device 400 by vertically shaking the piezoelectric power generator 100 or the portable electronic device 400 including the piezoelectric power generator 100.

Specifically, the piezoelectric power generator 100 according to exemplary embodiments of the present invention, which modifies the piezoelectric bodies 170 and 172 into the 15-mode type, can yield more power than a conventional piezoelectric power generator using the 31-mode piezoelectric body.

Now, a piezoelectric power generator 200 for feeding the emergency power according to another exemplary embodiment is illustrated.

Figure 7:
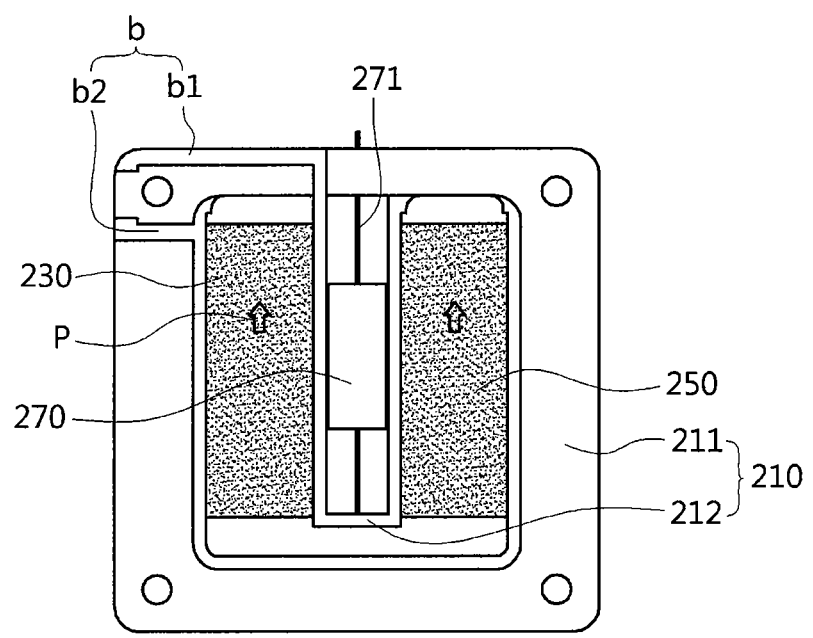
FIG. 7 is a front view of the piezoelectric power generator for feeding the emergency power according to another exemplary embodiment of the present invention.

FIG. 7 is a front view of the piezoelectric power generator 200 for feeding the emergency power (hereafter, referred to as a piezoelectric power generator) according to another exemplary embodiment of the present invention.

Referring to FIG. 7, the piezoelectric power generator 200 includes a frame 210, a first piezoelectric body 230, a second piezoelectric body 250, and a vibration unit 270.

The frame 210 includes an exterior unit 211 and a partition unit 212. The exterior unit 211 forms the exterior of the frame 210. The partition unit 212 protrudes and extends from the upper center to the inside of the exterior unit 211. Hence, the interior of the frame 210 is divided into three spaces by the partition unit 212. In more detail, the interior of the frame 210 is divided into the left space, the right space, and the inner space of the partition unit 212.

The frame 210 can form rims of the exterior unit 211 and the partition unit 212 in a circular shape. When the circular rim is formed, the first piezoelectric body 230 is disposed between the left side of exterior unit 211 and the left side of the partition unit 212. That is, the first piezoelectric body 230 is disposed in the left space of the partition unit 212.

the second piezoelectric body 250 is disposed between the right side of exterior unit 211 and the right side of the partition unit 212. That is, the second piezoelectric body 250 is disposed in the right space of the partition unit 212.

The material, the shape, the size or the polarization direction P of the first piezoelectric body 230 and the second piezoelectric body 250 are substantially the same or similar to those in the above-stated embodiment and thus shall be omitted here.

The first piezoelectric body 230 and the second piezoelectric body 250 can be plural. That is, the plurality of the first piezoelectric bodies 230 can be arranged in a row at intervals in the left space of the partition unit 212. The plurality of the second piezoelectric bodies 250 can be arranged in a row at intervals in the right space of the partition unit 212.

The vibration unit 270 is disposed inside the partition unit 212. The vibration unit 270 can vibrate vertically. For example, a shaft 271 is installed longitudinally at the center in the partition unit 212, and coupled to the vibration unit 270. Thus, the vibration 270 can vertically vibrate along the shaft 271.

The vibration unit 270 has a specific gravity. Hence, the vibration unit 270 can hit the bottom of the partition unit 212 with the applied external force. The vibration unit 270 can be fabricated with tungsten (W), gold (AU), or Bismuth (Bi) which have a relatively great specific gravity among the metals.

The piezoelectric power generator 200 can further include an electrode unit b connected to the first piezoelectric body 230 and the second piezoelectric body 250 respectively. For example, the electrode unit b can include a first electrode b1 disposed along the partition unit 212 and extending in one edge of the exterior unit 211, and a second electrode b2 disposed along the inner rim of the exterior part 211 in parallel with the first electrode b1.

Figure 8:
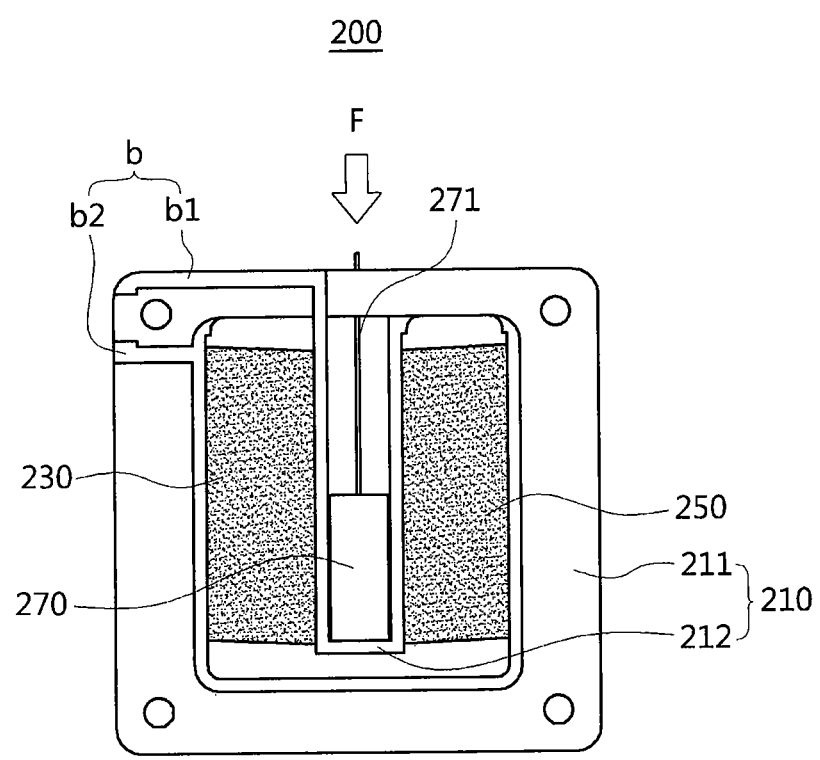
FIG. 8 is an operational diagram of the piezoelectric power generator for feeding the emergency power of FIG. 7.

FIG. 8 is an operational diagram of the piezoelectric power generator 200 of FIG. 7.

In FIG. 8, when the user vertically shakes the piezoelectric power generator 200, the vibration unit 270 vertically vibrates along the shaft 271. The vibration unit 270 hits the bottom of the partition unit 212, and the hit bottom side of the partition unit 212 is temporarily deformed downward.

The first piezoelectric body 230 and the second piezoelectric body 250 are fixed in the left space and the right space of the partition unit 212 respectively. Hence, when the lower part of the partition unit 212 is temporarily deformed downward, the right part of the first piezoelectric body 230 is deformed downward and the left part of the second piezoelectric body 250 is deformed downward. That is, the first piezoelectric body 230 and the second piezoelectric body 250 are shear-deformed.

According to the shear deformation, the first piezoelectric body 230 and the second piezoelectric body 250 can generate the electricity and accumulate the generated electricity to the accumulator or the battery. The accumulation of the electricity generated by the piezoelectric body has been described and shall be omitted here.

FIG. 9 is a schematic diagram of an application of the piezoelectric power generator 200 FIG. 7.

Referring to FIG. 9, two or more piezoelectric power generators 200 can be stacked by crossing at 90 degrees. For example, the first piezoelectric power generator 201 is disposed. Next, the second piezoelectric power generator 202 rotated clockwise from the first piezoelectric power generator 201 at 90 degrees is stacked on the first piezoelectric power generator 201. The third piezoelectric power generator 203 rotated clockwise from the second piezoelectric power generator 202 at 90 degrees is stacked on the second piezoelectric power generator 202. The fourth piezoelectric power generator 204 rotated clockwise from the third piezoelectric power generator 203 at 90 degrees is stacked on the third piezoelectric power generator 203.

The piezoelectric power generators 200 include a hole h at each corner of the exterior unit 211 of the frame 210. The piezoelectric power generators 200 can be stacked and united by inserting a fastener (for example, a bolt and a nut) into the hole h.

When the piezoelectric power generators 200 are stacked as above, the user can shake the piezoelectric power generator 200 in four directions, rather than in one direction, to generate the electricity. Hence, convenience and efficiency of the electricity generation are enhanced. Note that the piezoelectric power generator 100 of the one embodiment can be constructed in this manner.

As set forth above, by applying the 15-mode piezoelectric body to the piezoelectric power generator, the considerable piezoelectric power can be attained, compared to the 31-mode piezoelectric body.

In addition, with the notable portability, the emergency power can be fed to the mobile communication and portable electronic devices in the emergency.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A piezoelectric power generator for feeding emergency power, comprising:
    a frame;
    a fixing unit comprising a left fixing body coupled to a left part of the frame and a right fixing body coupled to a right part of the frame;
    a first piezoelectric body attached to a right part of the left fixing body;
    a second piezoelectric body attached to a left part of the right fixing body;
    a vibration unit attached between the first piezoelectric body and the second piezoelectric body and configured to vibrate transversly to a direction extending between the right and left parts of the frame, wherein the vibration unit includes a Printed Circuit Board (PCB);
    first and second masses respectively disposed inside an upper part and a lower part of the frame and configured to move vertically in the upper part and the lower part of the frame;
    a first elastic unit connected between the first mass and a top end of the vibration unit; and
    a second elastic unit connected between the second mass and a bottom end of the vibration unit.

2. The piezoelectric power generator of claim 1, wherein the elastic unit includes an elastic wire or a spring.

3. The piezoelectric power generator of claim 1, further comprising:
    an electrode unit connected to the first piezoelectric body and the second piezoelectric body.

4. A piezoelectric power generator assembly, comprising two or more piezoelectric power generators of claim 1,
    wherein the piezoelectric power generators are stacked on top each other, a vibrating direction of the vibration unit of one of the piezoelectric power generators crossing a vibrating direction of the vibration unit of another one of the piezoelectric power generators at 90 degrees.

5. The piezoelectric power generator of claim 1, further comprising:
    a case unit for covering an exterior of the piezoelectric power generator.

6. A portable electronic device, comprising the piezoelectric power generator of claim 1, wherein the piezoelectric power generator is mounted inside or outside the portable electronic device, and
    the portable electronic device is configured to receive at least part of power generated by vibrations of the vibrating unit from the piezoelectric power generator.

7. A piezoelectric power generator for feeding emergency power, comprising:
    a frame comprising an exterior unit and a partition unit, the partition unit projecting and extending in a direction from an upper part of the exterior unit to a lower part of the exterior unit and dividing an inner space of the exterior unit;
    a first piezoelectric body disposed between a left part of the exterior unit and a left part of the partition unit;
    a second piezoelectric body disposed between a right part of the exterior unit and a right part of the partition unit;
    a vibration unit configured to vibrate in said direction inside the partition unit, wherein the vibration unit includes a Printed Circuit Board (PCB);
    first and second masses respectively disposed inside an upper part and a lower part of the frame and configured to move vertically in the upper part and the lower part of the frame;
    a first elastic unit connected between the first mass and a top end of the vibration unit; and
    a second elastic unit connected between the second mass and a bottom end of the vibration unit.

8. The piezoelectric power generator of claim 7, further comprising more than one pairs of the first and second piezoelectric bodies.

9. The piezoelectric power generator of claim 7, wherein the vibration unit is comprises one or more selected from the group consisting of tungsten (W), gold (Au), and Bismuth (Bi).

10. The piezoelectric power generator of claim 7, further comprising:
    an electrode unit connected to the first piezoelectric body and the second piezoelectric body.

11. A piezoelectric power generator assembly, comprising two or more piezoelectric power generators of claim 7, wherein the piezoelectric power generators are stacked on top each other, a vibrating direction of the vibration unit of one of the piezoelectric power generators crossing a vibrating direction of the vibration unit of another one of the piezoelectric power generators at 90 degrees.

12. The piezoelectric power generator of claim 7, further comprising:
a case unit for covering an exterior of the piezoelectric power generator.

* * * * *